US006403963B1

(12) United States Patent
Nikzad et al.

(10) Patent No.: US 6,403,963 B1
(45) Date of Patent: Jun. 11, 2002

(54) DELTA-DOPED CCD'S AS LOW-ENERGY PARTICLE DETECTORS AND IMAGERS

(75) Inventors: Shouleh Nikzad; Michael E. Hoenk, both of Valencia; Michael H. Hecht, Los Angeles, all of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/162,918

(22) Filed: Sep. 29, 1998

Related U.S. Application Data

(60) Provisional application No. 60/061,408, filed on Sep. 29, 1997.

(51) Int. Cl.[7] .......................... H01L 29/796; G01T 1/21

(52) U.S. Cl. .............................. 250/370.01; 250/370.14

(58) Field of Search ........................ 250/370.01, 370.14

(56) References Cited

U.S. PATENT DOCUMENTS

| 4,798,958 A | * | 1/1989 | Janesick et al. ....... 250/370.01 |
| 4,822,748 A | * | 4/1989 | Janesick et al. ....... 250/370.14 |
| 5,376,810 A | * | 12/1994 | Hoenk et al. ................ 257/228 |
| 5,701,016 A | * | 12/1997 | Burroughes et al. .......... 257/24 |

* cited by examiner

*Primary Examiner*—Constantine Hannaher
*Assistant Examiner*—Otilia Gabor
(74) *Attorney, Agent, or Firm*—Fish & Richardson P.C.

(57) ABSTRACT

The back surface of a thinned charged-coupled device (CCD) is treated to eliminate the backside potential well that appears in a conventional thinned CCD during backside illumination. The backside of the CCD includes a delta layer of high-concentration dopant confined to less than one monolayer of the crystal semiconductor. The thinned, delta-doped CCD is used to detect very low-energy particles that penetrate less than 1.0 nm into the CCD, including electrons having energies less than 1000 eV and protons having energies less than 10 keV.

17 Claims, 4 Drawing Sheets

DELTA-DOPED CCD'S AS LOW-ENERGY PARTICLE DETECTORS AND IMAGERS

CROSS REFERENCE TO RELATED APPLICATIONS

This application claims the benefit of the U.S. Provisional Application No. 60/061,408, filed on Sep. 29, 1997, which is incorporated herein by reference.

STATEMENT AS TO FEDERALLY SPONSORED RESEARCH

The invention described herein was made in the performance of work under a NASA contract, and is subject to the provisions of Public Law 96-517 (35 USC 202) in which the Contractor has elected to retain title.

BACKGROUND

The invention relates to using a delta-doped charge-coupled device (CCD) for low-energy particle detection and imaging.

A charge-coupled device (CCD) includes an array of coupled electronic gates, such as metal-oxide-semiconductor field effect transistors (MOSFETs), that together convert optical or particle energy into an electronic signal. CCDs are used in a wide variety of applications, including digital imaging systems such as digital cameras.

FIG. 1A shows the general structure of a thinned CCD 10, which commonly is used for ultraviolet light detection. The CCD 10 includes a semiconductor core 12 comprising, e.g., lightly doped silicon, onto which a thin insulating layer 14, e.g., a layer of silicon oxide, is formed. An oppositely charged dopant layer 15, e.g., n-type dopant, may be implanted at the front surface 24 of the semiconductor core 12 to form a "buried channel" CCD, which is described below. A conductive gate 16 is formed on the front surface 18 of the insulating layer 14 to apply an electric potential to the device. Typically, the back surface 20 of the semiconductor substrate 12 includes a thin, insulating native oxide layer 22 that forms naturally on the semiconductor's back surface 25.

In operation, the conductive gate 16 is biased with respect to the back surface 20 of the semiconductor substrate 12 by a voltage supply V. As photons or particles strike the device 10 through its back surface, electron-hole pairs form in the substrate core 12. Depending on whether the semiconductor is p-type or n-type, the electrons or the holes migrate toward the semiconductor-oxide surface 24, where they accumulate in a "collection well" 26 (FIG. 1B) that develops in the semiconductor 12 near the semiconductor-oxide surface 24. The implanted layer 15 creates a buried channel where collected charge accumulates in the semiconductor core 12 a given distance below the insulating layer 14.

Incident energy from photons or particles is converted into charge in the semiconductor core, and the charge accumulates in the collection well during a given integration period. The amount of charge collected in the well 26 during the integration period is generally proportional to the total energy of the particles penetrating the semiconductor 12 during the integration period. The efficiency of the conversion of energy to charge depends on the energy-dependant interaction of photons or particles in the CCD structure. Therefore, different CCD structures can have markedly different efficiencies. The CCD 10 generates an output signal by serial measurement of the charge collected in each pixel during the integration period.

The thickness of the semiconductor core 12 in a typical thinned CCD 10 is 8–15 μm, which allows the thinned CCD to detect some particles striking its back surface 25. For example, a typical thinned CCD can detect electrons having kinetic energies greater than about 10 keV. The sensitivity of the thinned CCD to these low-energy particles is limited, however, by a "dead layer" caused by the presence of a "potential well" 28 (FIG. 1B), which forms near the substrate's back surface 25 as a result of charge trapped in the native oxide layer 22. Particles moving with kinetic energies below a certain level do not penetrate far enough into the CCD to overcome the potential well.

Backside surface treatment technology has been used to alter the CCD structure and thus to reduce the effects of the potential well 28. These techniques include UV-induced adsorption of negative ions on the native oxide surface, deposition of a conductive layer over the oxide, and introduction of a thin p+ layer by ion implantation. Backside treatment has improved the particle detection capabilities of CCDs, but the utility of CCDs as particle detectors is limited by the CCD structures. For example, using conventional detectors, detection of electrons is limited to particles with energies above 1 keV, and detection of protons is limited to particles with energies above 10 keV.

SUMMARY

The inventors have recognized that a backside-thinned delta-doped CCD can be used to detect very-low-energy particles, including electrons with energy levels less than 1 keV and as low as 50 eV, and protons with energies less than 10 keV and as low as 1.2 keV. The delta-doped CCD exhibits a gain of approximately 170 for 1 keV electrons, which represents more than 200% improvement over conventional backside-treated, thinned CCDs, such as biased flash-gate CCDs. This discovery allows for the use of CCDs in more sophisticated, low-energy particle applications, such as detecting and imaging electrons in low-energy electron diffraction (LEED) spectroscopy, low-energy reflection electron energy loss spectroscopy (REELS), and low-energy plasma detection.

The invention relates to using a backside-thinned, delta-doped CCD to detect low-energy particles by exposing the back surface of the CCD to the particles and then detecting the presence of electric charge in the CCD that results from the penetration of the low-energy particles into the CCD. In some implementations, the CCD includes a p-type semiconductor substrate having a $p^+$ delta layer over its back surface. Low-energy particles may include particles that penetrate no deeper than 1.0 nm and as little as 0.5 nm into the CCD, e.g., electrons having energies as low as 50 eV and protons having energies as low as 1.2 keV.

Other embodiments and advantages will become apparent from the following description and from the claims.

DETAILED DESCRIPTION

Figure 1A:
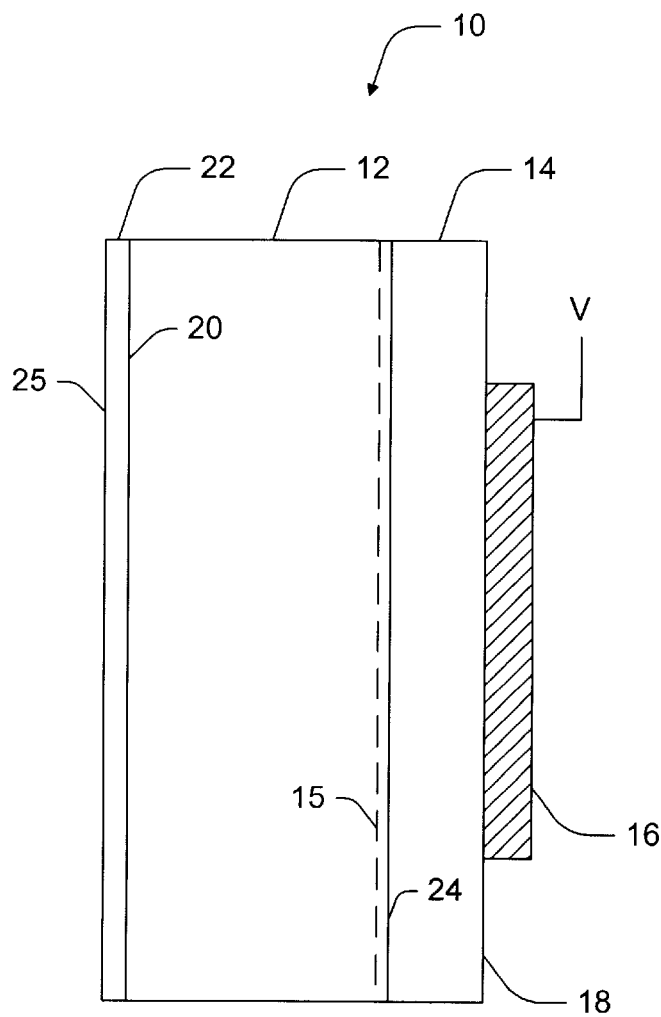
FIG. 1A is a partial cross-sectional view of a conventional thinned CCD.
Figure 1B:
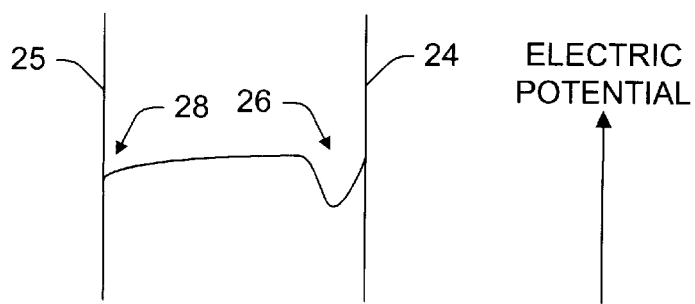
FIG. 1B shows the electric potential well that forms in a conventional thinned CCD.
Figure 2:
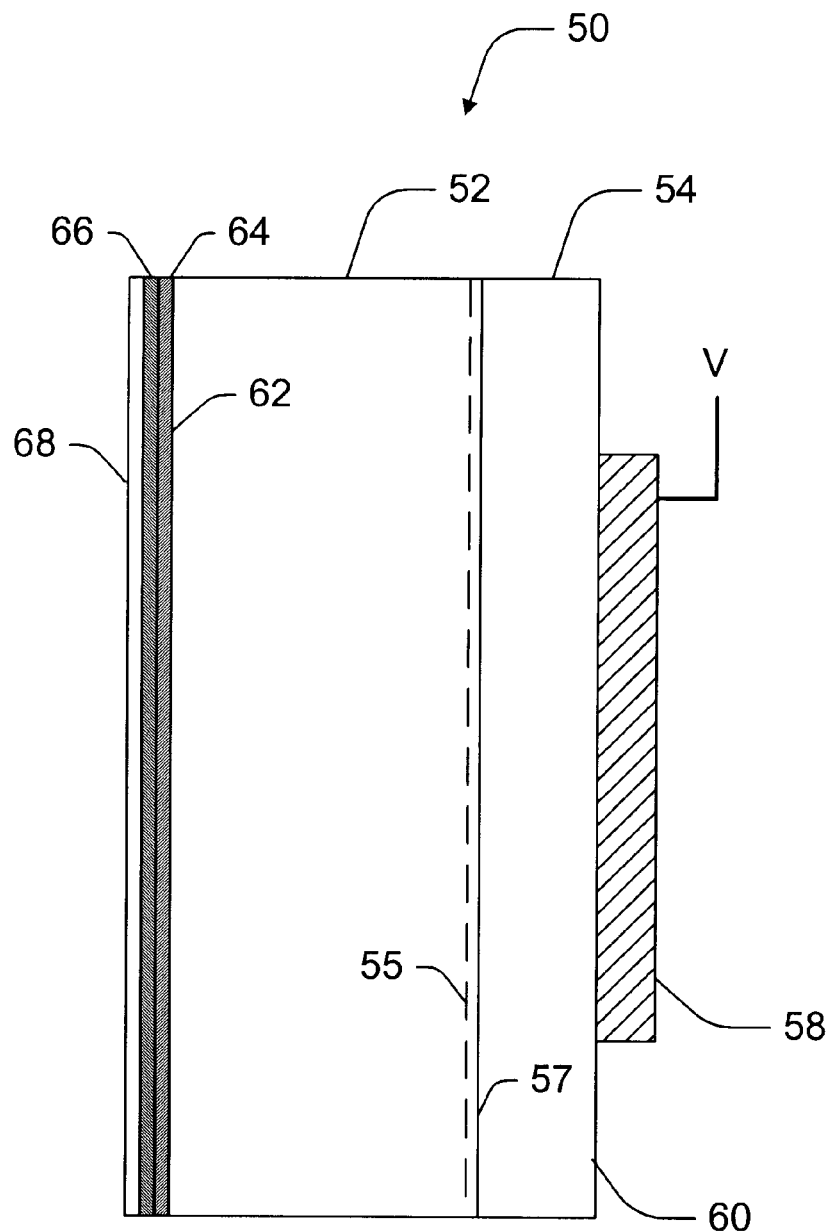
FIG. 2 is a partial cross-sectional view of a thinned CCD having a backside delta layer.

FIG. 2 shows the general structure of a "delta-doped", thinned CCD 50 capable of detecting particles having penetration depths into silicon as low as 0.5 nm to 1.0 nm. Like a conventional thinned CCD, the delta-doped CCD 50 includes a lightly doped semiconductor core 52 with an insulating material 54 formed on its front surface 57. An oppositely charged doping layer 55 may be implanted on the front surface 57 of the semiconductor core 52 to create a "buried channel" CCD. The thinned CCD also includes an array of conductive gates 58 on the front surface 60 of the insulating layer 54.

The back surface 62 of the semiconductor substrate 52 includes several layers not found on a conventional thinned CCD. The innermost layer 64 is an epilayer of heavily doped semiconductor material, typically of the same type forming the semiconductor core 52. The middle layer is a very thin delta epilayer 66 of dopant material having a very high surface concentration. The outer layer is a protective layer 68 of nominally undoped semiconductor material that prevents the delta layer 66 from oxidizing. The protective layer 68 may be treated, as described below, to form a protective oxide on its exposed surface.

In one implementation, the delta-doped, thinned CCD 50 includes a 15 μm silicon core 52, lightly doped with boron atoms at a concentration of approximately $10^{14}$ B/cm$^3$. The silicon core has an n-type implantation layer 55 at its front surface 57, onto which an insulating layer 54 of silicon oxide is deposited. The inner layer 64 on the back surface 62 of the CCD is a 1 nm layer of heavily doped silicon having a doping level of approximately $4 \times 10^{20}$ B/cm$^3$. The delta layer 66 consists of a very high concentration of boron atoms, with a surface density on the order of $2 \times 10^{14}$ B/cm$^2$, deposited by molecular beam epitaxy (MBE) and confined to less than one monolayer, e.g., ⅓ monolayer, of the silicon crystal. The outer layer 68 is a 1.5 nm layer of nominally undoped silicon, onto which a thin protective layer of silicon oxide is allowed to form.

Figure 3:
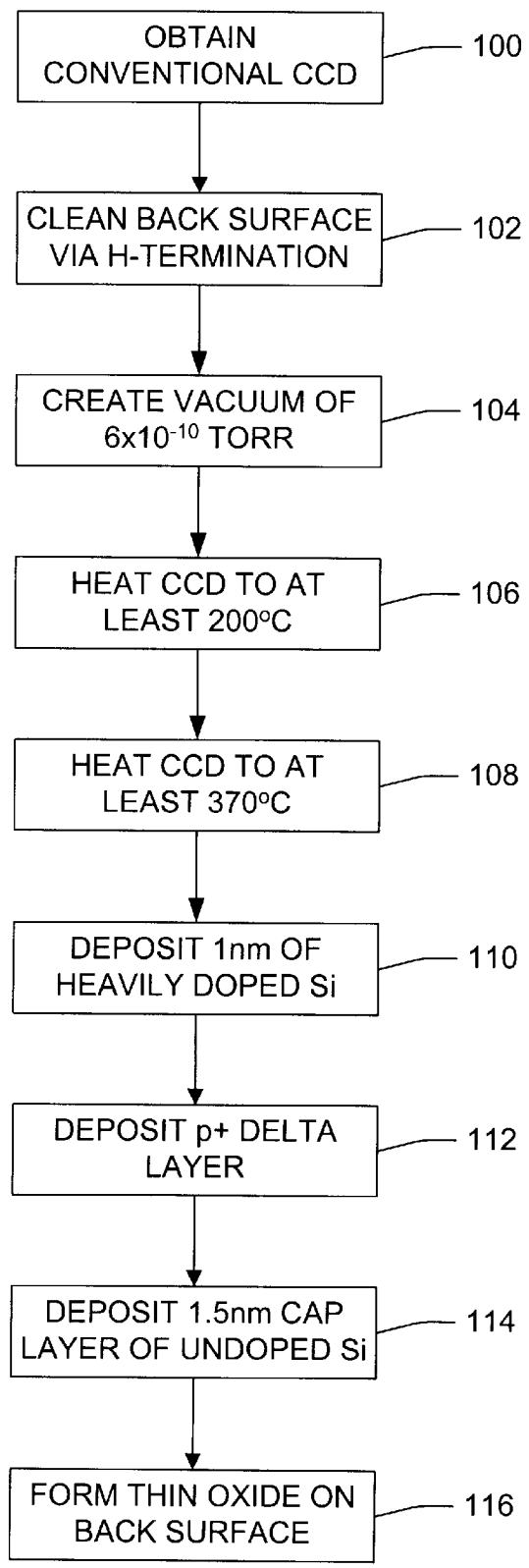
FIG. 3 is a simplified flow chart of a method for forming the backside delta layer.

FIG. 3 is a simplified flow chart for a process that may be used to form a delta-doped CCD. The process is described in more detail in U.S. Pat. No. 5,376,810, issued on Dec. 27, 1994, and incorporated in this application by reference. The process begins with the acquisition of a conventional thinned CCD, such as a fully processed, unmounted, and backside-thinned Reticon CCD (512×512 pixels, 27 μm/pixel) marketed by EG&G (step 100). The back surface of the CCD is cleaned and the native oxide layer is removed by conducting a conventional H-termination cleaning process (step 102). Cleaning the backside-thinned CCD in this manner exposes the device's semiconductor core. The CCD then is placed into a vacuum chamber and subjected to a vacuum on the order of $2 \times 10^{-10}$ torr (step 104). In the chamber, the CCD is heated first to a temperature of approximately 200° C. (step 106) and then to a temperature of at least 370° C. (step 108).

When the CCD reaches the appropriate temperature, the heavily doped semiconductor epilayer is deposited onto the back surface of the CCD using a conventional molecular beam epitaxy (MBE) technique (step 110). The delta layer then is formed via MBE by interrupting the semiconductor flux and allowing dopant atoms to accumulate on the surface (step 112). When the semiconductor flux resumes, the dopant profile contains a sharp peak, resembling the mathematical delta function. The protective layer of nominally undoped semiconductor materials then is deposited onto the delta layer (step 114). For a silicon CCD, a thin oxide layer (~20 Å) may be formed on the exposed surface of the protective layer by exposing the CCD to steam from boiling deionized water for several minutes.

In operation, the heavily doped semiconductor layer and the delta layer act to virtually eliminate the potential well that otherwise would form in the semiconductor substrate of a thinned CCD. As a result, the "dead layer" at the back surface of the substrate is eliminated, and charge generated by particles is collected at the semiconductor's front surface instead of at the potential well. As a result, efficiency is markedly improved in the delta-doped CCD structure. Deposition of the delta layer through molecular beam epitaxy, as described above, provides more effective and more permanent protection against potential wells than conventional backside treating processes. Moreover, the delta-doped structure is more efficient than the ion implanted structure, because the delta-doped CCD structure contains an atomically abrupt, high-concentration dopant profile and does not contain crystal lattice damage generally associated with ion implantation.

Figure 4:
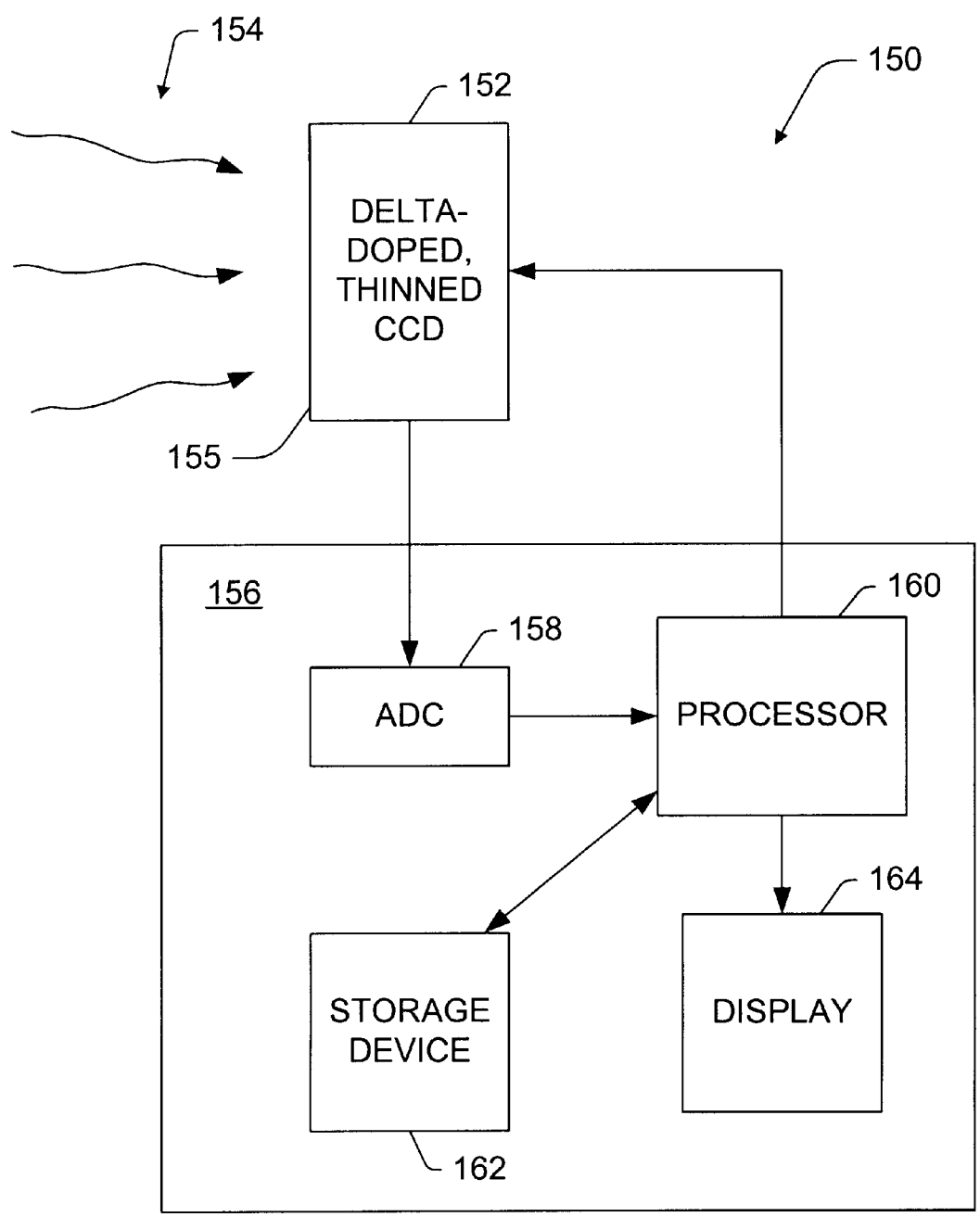
FIG. 4 is a schematic diagram of a low-energy particle detection system including a delta-doped CCD.

FIG. 4 shows a low-energy particle detection and imaging system 150 that employs a delta-doped CCD 152. The system 150 can be used, e.g., as a plasma detector to monitor solar wind. The delta-doped CCD 152 is positioned so that low-energy particles 154 penetrate the backside surface 156 of the CCD 152. With a conventional backside-treated CCD, charged particles must penetrate at least an effective amount, e.g., 50–100 nm into the semiconductor to overcome the backside potential well. With a delta-doped CCD, however, a particle must penetrate only 0.5 nm to 1.0 nm beyond the protective oxide film to create enough charge in the CCD for detection. At these small penetration depths, the delta-doped CCD can detect electrons having energies below 1 keV and as low as 50 eV and can detect protons having energies below 10 keV and as low as 1.2 keV.

The particle detection system 150 includes no obstructions or elements through which the low-energy particles 154 must pass to reach the CCD 152. Unlike conventional CCD-based particle detection systems, the delta-doped system 150 does not require, and should not include, any particle acceleration or amplification devices, such as microchannel plates. Instead, low-energy particles strike the back surface 155 of the delta-doped CCD 152 directly.

The CCD 152 collects charge over a given collection interval, the length of which is determined by the particular detection application. At the end of the collection interval, a processing device, such as a digital camera, measures the charge at each pixel via a serial read-out process.

The camera 156 includes an analog-to-digital converter (ADC) 158, which converts the analog output of the CCD into digital data. A processor 160 uses the data, e.g., to determine how many low-energy particles were received by the CCD 152 and to create an image of the particle flux. The processor may store the results in an electronic storage device 162 and display the image on a display device 164, such as a CRT monitor.

The invention is not limited to the implementations described above. Semiconductor and dopant materials other than silicon and boron may be used, and the materials may be used in concentrations other than those suggested above. For example, the CCD may include an n-type semiconductor with an n-type delta layer. Layer thicknesses and layer structures also may differ from those described above.

Moreover, other crystal growth processes and temperatures may be used to produce delta-doped CCDs. Accordingly, other embodiments are within the scope of the following claims.

What is claimed is:

1. A method for use in detecting low-energy particles, the method comprising:

providing a CCD having a back surface exposed to the low-energy particles, said CCD including an epilayer of heavily doped semiconductor material of same type as that of semiconductor core, a delta layer of highly concentrated dopant formed over a back surface of the semiconductor core and confined to less than one monolayer in the semiconductor core, and a protective layer of semiconductor material formed over the delta layer and having a thickness of approximately 1 nm;

exposing the back surface of the CCD to low-energy particles, such that the CCD is configured such that low-energy particles falling on the back surface, including electrons with energy levels between about 50 eV–100 eV or protons with energy levels between about 1200 eV–1000 eV, or both, create sufficient charge in the CCD for detection; and detecting a presence of electric charge in the CCD that results from penetration of the low-energy particles through the back surface into the CCD.

2. The method of claim 1, further comprising creating an image of a particle flux based on the detected electric charge.

3. The method of claim 1, wherein detecting the presence of electric charge comprises detecting electric charge attributable to particles having energies less than 750 eV.

4. The method of claim 1, wherein detecting the presence of electric charge comprises detecting electric charge attributable to particles having energies less than 500 eV.

5. The method of claim 1, wherein detecting the presence of electric charge comprises detecting electric charge attributable to particles having energies less than 250 eV.

6. The method of claim 1, wherein detecting the presence of electric charge comprises detecting electric charge attributable to particles having energies of approximately 50 eV.

7. The method of claim 1, wherein detecting the presence of electric charge comprises detecting electric charge attributable to protons having energies of approximately 1.2 keV.

8. The method of claim 1, wherein the CCD comprises a p-type semiconductor having a $p^+$ delta layer.

9. An apparatus for use in detecting low-energy particles comprising:

a backside-thinned, delta-doped CCD having a back surface exposed to the low-energy particles, said delta-doped CCD including:

an epilayer of heavily doped semiconductor material of same type as that of semiconductor core, a delta layer of highly concentrated dopant formed over a back surface of the semiconductor core and confined to less than one monolayer in the semiconductor core, and a protective layer of semiconductor material formed over the delta layer and having a thickness of approximately 1 nm, such that the backside-thinned, delta-doped CCD is configured such that low-energy particles falling on the back surface, including electrons with energy levels between about 50 eV–100 eV or protons with energy levels between about 1200 eV–1000 eV, or both, create sufficient electric charge in the CCD for detection; and circuitry configured to detect the presence of electric charge in the CCD that results from the penetration of the low-energy particles through the back surface into the CCD.

10. The apparatus of claim 9, wherein the circuitry is configured to create an image of a particle flux based on the detected charge.

11. The apparatus of claim 9, wherein the circuitry is configured to detect the presence of electric charge attributable to electrons-having energies less than 750 eV.

12. The apparatus of claim 9, wherein the circuitry is configured to detect the presence of electric charge attributable to electrons having energies less than 500 eV.

13. The apparatus of claim 9, wherein the circuitry is configured to detect the presence of electric charge attributable to electrons having energies less than 250 eV.

14. The apparatus of claim 9, wherein the circuitry is configured to detect the presence of electric charge attributable to electrons having energies of approximately 50 eV.

15. The apparatus of claim 9, wherein the circuitry is configured to detect the presence of electric charge attributable to protons having energies of approximately 1.2 keV.

16. The apparatus of claim 9, wherein the CCD comprises a p-type semiconductor having a $p^+$ delta layer.

17. An apparatus for use in detecting low-energy particles comprising:

a CCD comprising:

a doped semiconductor core having a thickness between 8 nm and 15 nm, a semiconductor-oxide insulating layer formed over a front surface of the semiconductor core, a conductive gate formed over the insulating layer, an epilayer of heavily doped semiconductor material of same type as that of semiconductor core, a delta layer of highly concentrated dopant formed over a back surface of the semiconductor core and confined to less than one monolayer in the semiconductor core, and a protective layer of semiconductor material formed over the delta layer and having a thickness of approximately 1 nm, where said CCD is configured such that low-energy particles falling on the back surface, including electrons with energy levels between about 50 eV–100 eV or protons with energy levels between about 1200 eV–1000 eV, or both, create sufficient charge in the CCD for detection; and processing circuitry configured to detect the presence of electric charge in the CCD that results from the penetration of the low-energy particles no more than approximately 1.0 nm into the CCD through the protective layer.

* * * * *